(12) United States Patent
Xiong et al.

(10) Patent No.: US 12,235,552 B2
(45) Date of Patent: Feb. 25, 2025

(54) DISPLAY PANEL, ACTIVE MATRIX SUBSTRATE, AND METHOD FOR REPAIRING WHITE DEFECT OF DISPLAY PANEL

(71) Applicant: Century Technology (Shenzhen) Corporation Limited, Shenzhen (CN)

(72) Inventors: Yuan Xiong, Shenzhen (CN); Chih-Chung Liu, New Taipei (TW); Ming-Tsung Wang, New Taipei (TW); Meng-Chieh Tai, New Taipei (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 705 days.

(21) Appl. No.: 17/361,657

(22) Filed: Jun. 29, 2021

(65) Prior Publication Data
US 2021/0325743 A1    Oct. 21, 2021

Related U.S. Application Data

(62) Division of application No. 16/261,968, filed on Jan. 30, 2019, now Pat. No. 11,079,640.

(30) Foreign Application Priority Data

Feb. 9, 2018   (CN) .......................... 201810136842.8

(51) Int. Cl.
*G02F 1/1362*   (2006.01)
*G02F 1/13*   (2006.01)
(Continued)

(52) U.S. Cl.
CPC ...... *G02F 1/136259* (2013.01); *G02F 1/1368* (2013.01); *H01L 27/124* (2013.01);
(Continued)

(58) Field of Classification Search
CPC .............. H01L 27/124; H01L 27/1248; H01L 27/1262; G02F 1/136259; G02F 1/1368;
(Continued)

(56) References Cited

U.S. PATENT DOCUMENTS 5,223,961 A * 6/1993 Ukai ..................... G02F 1/1309
349/55
2006/0126004 A1* 6/2006 Kim .................. G02F 1/136259
349/192

(Continued)

FOREIGN PATENT DOCUMENTS

| CN | 101034212 A | 9/2007 |
|---|---|---|
| CN | 101702061 A | 5/2010 |
| CN | 103488013 A | 1/2014 |

*Primary Examiner* — Shaun M Campbell
*Assistant Examiner* — Teresa M. Arroyo
(74) *Attorney, Agent, or Firm* — ScienBiziP, P.C.

(57) ABSTRACT

A method for repairing a white defect of a LCD panel includes providing a substrate, the substrate defining pixel areas which themselves comprise a base, a first metal layer, a first insulating layer, a semi-conductor layer, an ohmic contact layer, a source electrode, a drain electrode, and a second insulating layer; forming a through hole by laser in the second insulating layer, the through hole extending through the second insulating layer and separating the drain electrode into two spaced parts; forming a third insulating layer to cover the first conductive layers, the second insulating layer and the though hole and forming a second (Continued)

conductive layer by laser on the third insulating layer to couple the first conductive layer to the second conductive layer.

7 Claims, 7 Drawing Sheets

(51) Int. Cl.
    *G02F 1/1333*     (2006.01)
    *G02F 1/1368*     (2006.01)
    *H01L 27/12*     (2006.01)
(52) U.S. Cl.
    CPC ...... H01L 27/1248 (2013.01); H01L 27/1262 (2013.01); *G02F 1/1309* (2013.01); *G02F 1/133345* (2013.01); *G02F 1/136227* (2013.01); *G02F 1/136263* (2021.01); *G02F 2201/121* (2013.01); *G02F 2201/123* (2013.01); *G02F 2203/64* (2013.01)
(58) Field of Classification Search
    CPC ............. G02F 1/1309; G02F 1/133345; G02F 1/136227; G02F 1/136263; G02F 2201/121; G02F 2201/123; G02F 2203/64
    See application file for complete search history.

(56) References Cited

U.S. PATENT DOCUMENTS

| | | | |
|---|---|---|---|
| 2006/0258035 A1* | 11/2006 | Ooishi | H01L 27/124 438/30 |
| 2006/0285029 A1* | 12/2006 | Yoo | G02F 1/136259 349/54 |
| 2007/0158655 A1* | 7/2007 | Lin | H01L 27/124 257/E27.111 |
| 2007/0194331 A1* | 8/2007 | Yeh | G02F 1/136259 257/88 |
| 2008/0049155 A1* | 2/2008 | Yagi | H01L 27/124 445/24 |
| 2008/0117344 A1* | 5/2008 | Kim | H01L 27/1248 349/39 |
| 2008/0217687 A1* | 9/2008 | Tsou | G02F 1/136259 438/4 |
| 2011/0170045 A1* | 7/2011 | Lee | G02F 1/136259 257/E33.001 |
| 2013/0329153 A1 | 12/2013 | Yu et al. | |
| 2014/0043510 A1* | 2/2014 | Kasuga | H04N 25/65 348/300 |
| 2015/0171154 A1* | 6/2015 | Kang | H10K 59/1213 438/151 |

* cited by examiner

DISPLAY PANEL, ACTIVE MATRIX SUBSTRATE, AND METHOD FOR REPAIRING WHITE DEFECT OF DISPLAY PANEL

FIELD

The subject matter herein to a display panel, active matrix substrate and method for repairing a white defect of display panel

BACKGROUND

In IPS liquid crystal display (LCD) panels, a channel layer of a thin film transistor (TFT) in each subpixel typically consists of a stack-up of a semi-conductor layer and an ohmic contact layer. It is necessary to remove the ohmic contact layer deposited above the semi-conductor layer and between a source electrode and a drain electrode when a channel area is formed during manufacturing of the LCD panel. The ohmic contact layer is made of highly concentrated doped semi-conductor such as n+a-Si (doped n type semiconductor). However, the ohmic contact layer of certain subpixels cannot be removed completely due to a bias in manufacturing. As a result, doped ions remain on the semi-conductor layer. The subpixels ought to maintain a pre-set voltage after gate electrode completes charging the subpixels and turns off. However, current leaks from the source electrode to the drain electrode due to doped ions remaining. Thus, the drain electrode cannot maintain the pre-set voltage, as a result, a display voltage of the subpixel differs from the pre-set voltage, and thus, a grayscale of the subpixel differs from a pre-set grayscale, causing a white defect.

Repairing such an LCD panel usually checks whether a white defect occurs in an image of an LCD display device using an LCD Light-on test. A plurality of liquid crystals are placed into a gap between a color filter substrate and an array substrate. The color filter substrate, the array substrate, and the plurality of liquid crystals are sealed. The LCD panel is assembled with a plurality of optical films and a backlight module using a bezel. Thereby, production of the LCD display device is completed. It is possible to separate a drain electrode into two parts spaced apart from each other by using a laser when a certain subpixel is found to have the white defect. A common electrode can be coupled to a pixel electrode so that a voltage difference between the common electrode and the pixel electrode becomes 0V. The pixel electrode is also separated into two parts spaced apart from each other while the drain electrode is separated into two parts by using the laser. As to an LCD panel of normal black type (meaning an LCD panel showing black (non-transmission of light) when no voltage is applied), for example, an IPS LCD panel, when a voltage applied on a liquid crystal layer becomes 0V, the transmission rate of light becomes approximately 0V. The voltage applied on the liquid crystal layer refers to a voltage between the common electrode and the pixel electrode. The white defect turns into a dark defect (meaning the subpixel shows black). However, the two parts of the drain electrode are exposed to air and oxidation occurs during the repairing, thus affecting a display quality. Meanwhile, a gate insulating layer deposited above a gate electrode is also damaged, which causes oxidation of the gate electrode. As a result, a signal transmission of the gate electrode is affected. Therefore, there is room for improvement within the art.

BRIEF DESCRIPTION OF THE DRAWINGS

Implementations of the present technology will now be described, by way of example only, with reference to the attached figures.

DETAILED DESCRIPTION

Figure 1:
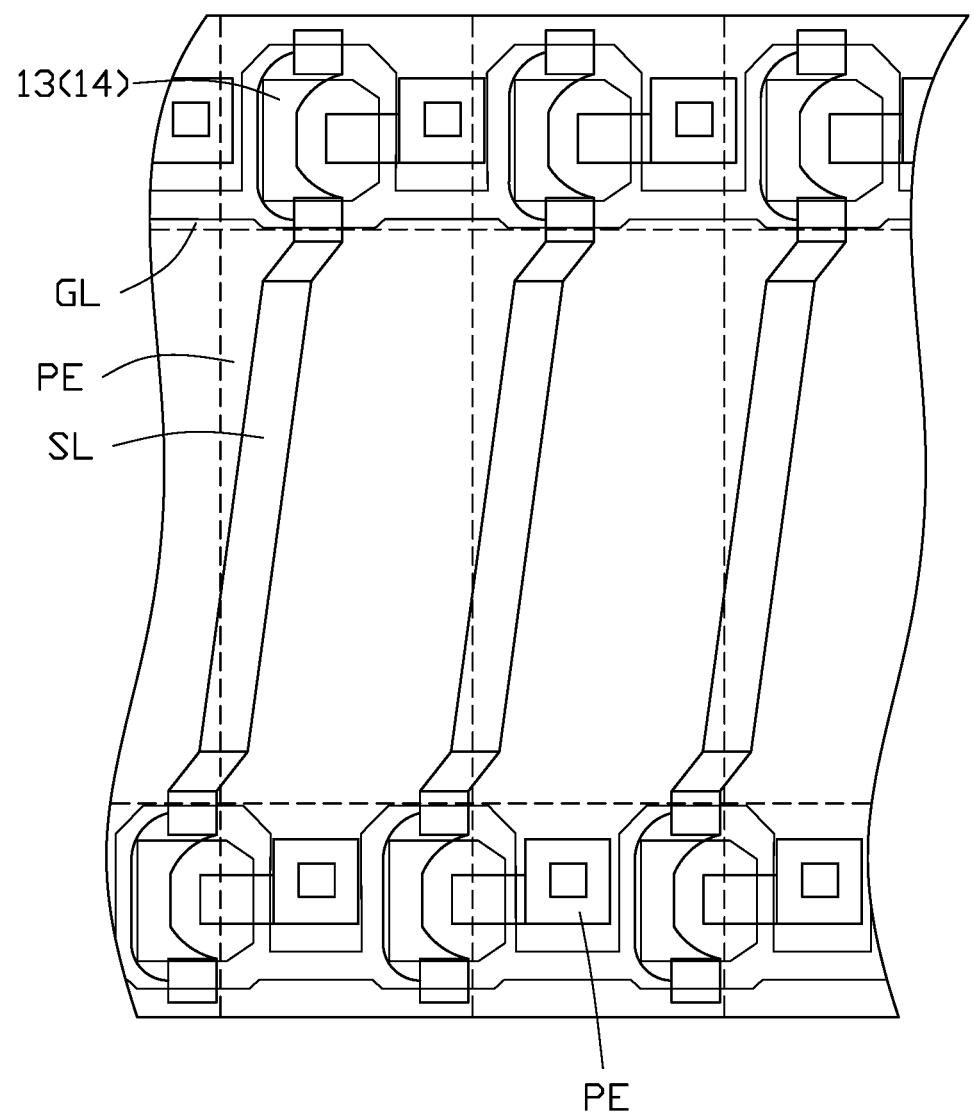
FIG. 1 is a plan view of a substrate before repairs according to the first embodiment of the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates openended inclusion or membership in the so-described combination, group, series, and the like.

First Embodiment

A method for repairing a white defect of a display panel which is applicable to an LCD panel of NB type, for example, an IPS LCD panel is disclosed. In FIGS. 1, 2, and 3A through FIG. 3D, during the manufacturing of the LCD panel, the method can be applied to an active matrix substrate after a common electrode layer is formed. The active matrix substrate can be a TFT array substrate (TFT substrate).

Figure 6:
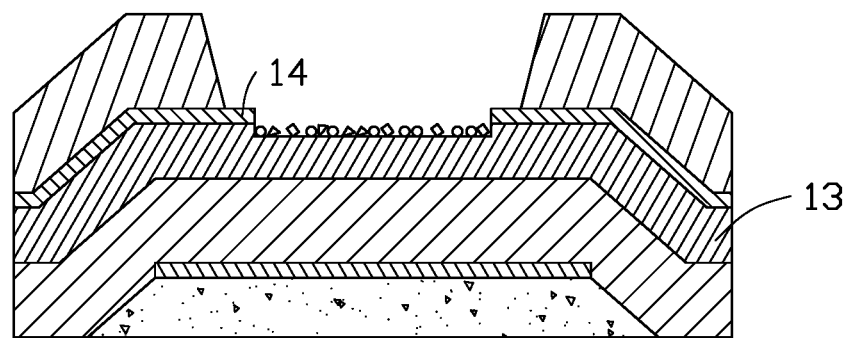
FIG. 6 is a cross-sectional view showing a circumstance in which an ohmic contact layer of a channel area of a TFT remains in the TFT.

An automatic optic inspection (AOI) is conducted on the substrate 100. Then a white defect of a pixel area is repaired by following steps, where an ohmic contact layer of a channel area of a TFT is detected as remaining in certain pixel areas, as shown in FIG. 6. Specifically, for example, the presence of color of the ohmic contact layer is detected in the channel area of the TFT, that is to say, there is part of the ohmic contact layer remaining between a source electrode SE and a drain electrode DE.

The method may include at least the following steps.

Figure 3A:
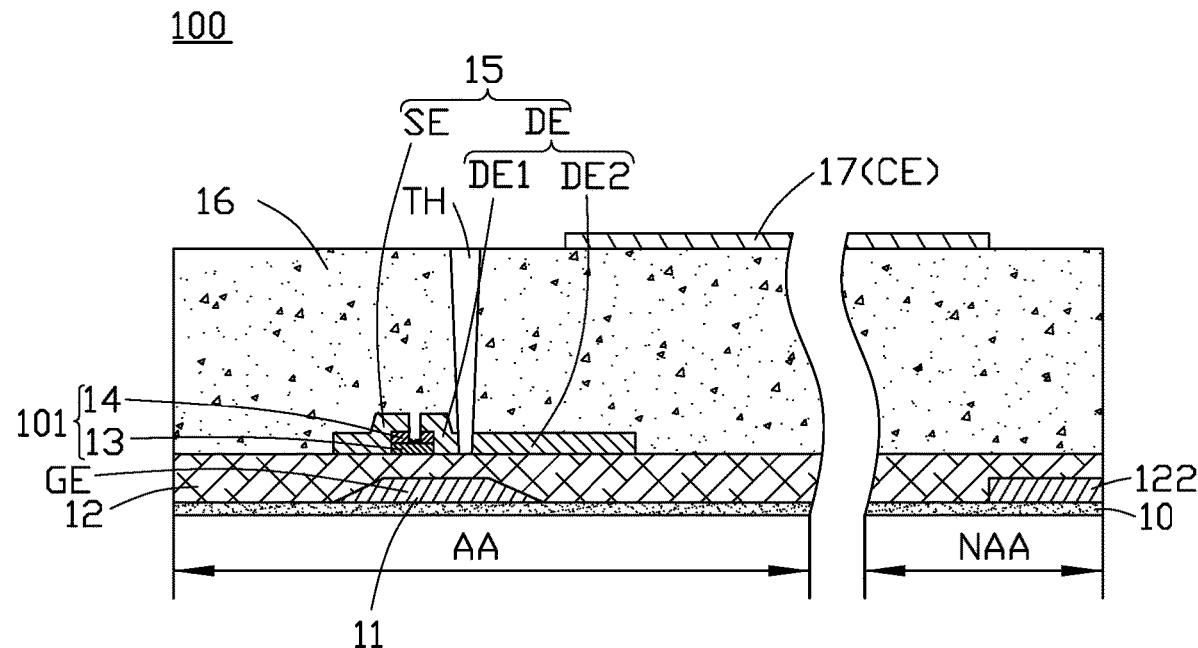
FIG. 3A through FIG. 3D are cross-sectional views showing a method for repairing a white defect of a display panel according to a first embodiment of the present disclosure.

Step I: as shown in FIG. 3A, a substrate 100 is provided.

The substrate 100 defines a display area AA (Active Area) used for displaying and a peripheral area NAA (Non Active Area) surrounding the display area AA. As FIG. 1 shows, a plurality of gate lines (or scan lines) GL parallel to each other and a plurality of parallel source lines (or data lines) SL parallel to each other are formed in the display area AA. The gate lines and the source lines intersect vertically to define a plurality of pixel areas. The pixel areas are arranged in a matrix. In each pixel area, a thin film transistor (TFT) is formed near an intersection of a source line SL and a gate line GL. The substrate 100 comprises a base 10, a first metal layer 11 formed on the base 10, and a first insulating layer 12 formed on a surface having the first metal layer 11 of the base 10. The first insulating layer 12 also covers the first metal layer 11. A semi-conductor layer 13 is formed on the first insulating layer 12. An ohmic contact layer 14 is formed on the semiconductor layer 13. The semi-conductor layer 13 and the ohmic contact layer 14 consist a channel layer 101. A second metal layer 15 is formed on the channel layer 101. A second insulating layer 16 covers the second metal layer 15, the channel layer 101, and the first insulating layer 12. A first conductive layer 17 is formed on the second insulating layer 16.

The base 10 shown in FIG. 3A can be made of a transparent insulating material, such as glass or transparent plastic material. The base 10 supports other parts of the substrate 100.

The first metal layer 11 can be a single layer film or a multi-layer film. The single layer film or the multi-layer film can be made of titanium, aluminum, molybdenum, copper, chromium or their alloys. They can be formed by sputtering and then patterning by photolithography. In this embodiment, a metallic stack-up of ALNd alloy and molybdenum is used as the material of the first metal layer 11. The first metal layer 11 comprises a gate electrode GE located in the display area and a peripheral metal electrode 122 in the peripheral area NAA. The first metal layer 11 can also comprise source line GLs and so on.

Transparent material, for example, silicon nitride, silicon oxide, photosensitive acrylic resin, or the like can be used as the material of the first insulating layer 12 (also called gate insulating film) and the second insulating layer 16. In this embodiment, the first insulating layer 12 can be formed of a g-SiNx film by using plasma enhanced chemical vapor deposition (PECVD), a photosensitive acrylic resin film being coated on the g-SiNx film.

The channel layer 101 deposited on the first insulating layer 12 corresponds with the gate electrode GE. The semi-conductor layer 13 can be made of amorphous silicon (a-si), polysilicon (p-si), monocrystalline silicon (c-si), or other semi-conductor materials with high resistance. In this embodiment, semi-conductor layer 13 is made of amorphous silicon. Additionally, for the semiconductor layer 13, Zinc Oxide, IGZO (indium gallium oxide), and other oxide semiconductors can be used. The semi-conductor layer 13 can be formed by using PECVD and photolithography patterning. Generally, the ohmic contact layer 14 can be a semiconductor layer with low resistance. In this embodiment, it is composed of n+a-Si (high concentration doped n type semiconductor), for example, amorphous silicon doped with phosphorus.

The second metal layer 15 can be manufactured in a same way as the metal layer 11. In this embodiment, the second metal layer 15 is composed of a sandwich of molybdenum aluminum molybdenum. The second metal layer 15 comprises a source electrode SE and a drain electrode DE. The source electrode SE and the drain electrode DE are spaced from each other on the opposite sides of the channel layer 101. Part of the source electrode SE and part of the drain electrode DE are deposited on a surface opposite to a surface having the semiconductor layer 13 of the ohmic contact layer 14. The part of the source electrode SE and the part of the drain electrode DE are coupled to the channel layer 101. The semiconductor layer 13 deposited between the source electrode SE and the drain electrode DE defines a channel area of the TFT. In this embodiment, only one subpixel with white defect is illustrated in FIG. 3A, that is to say, only the subpixel with the ohmic contact layer 14 of the channel area of a TFT remaining is illustrated. Therefore, residues of the ohmic contact layer 14 are illustrated. For defect-free subpixels there is no ohmic contact layer 14 remaining between the source electrode SE and the drain electrode DE. Moreover, the second metal layer 15 can also comprise source lines SLs.

The material of the first conductive layer 17 can be a transparent conductive material, such as indium tin oxide (ITO), indium oxide (IZO), zinc Oxide (ZnO), tin oxide (SnO), or their alloys. As a common electrode CE of the display panel, the first conductive layer 17 is continuous, extending in the display area AA and the peripheral area NAA.

Figure 4A:
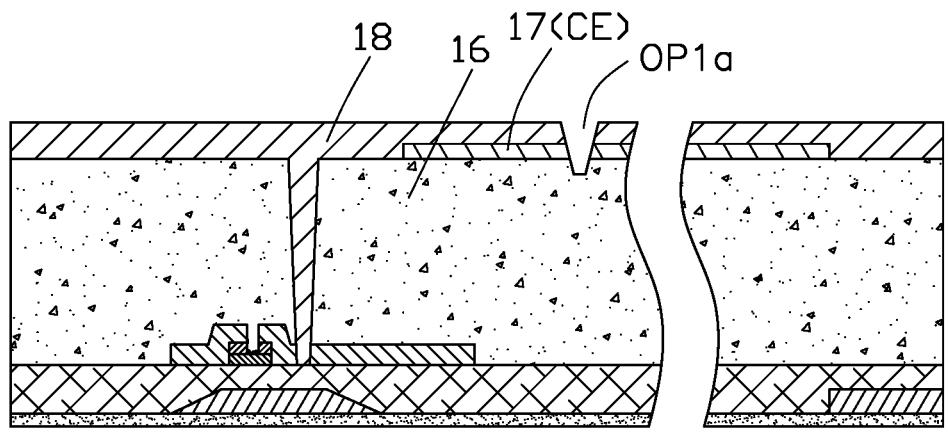
FIG. 4A through FIG. 4B are cross-sectional views showing a method for repairing a white defect of a display panel according to a second embodiment of the present disclosure.
Figure 4B:
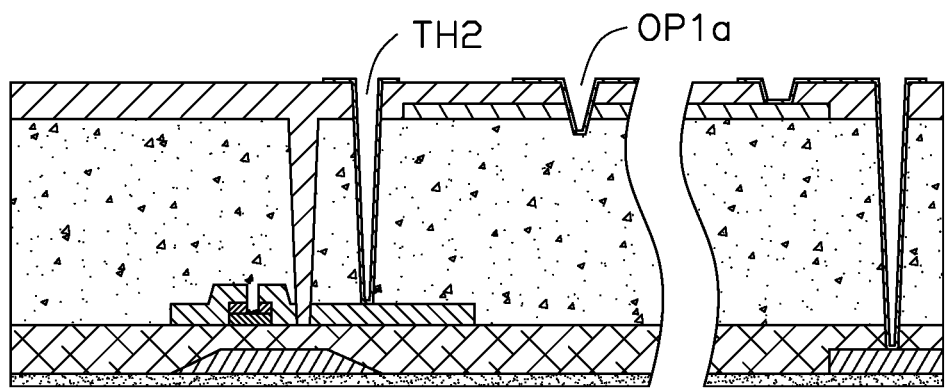
Figure 5:
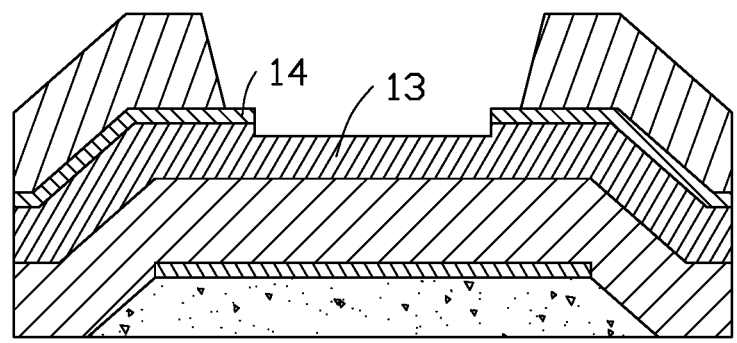
FIG. 5 is a cross-sectional view showing a circumstance in which an ohmic contact layer of a channel area of a TFT is completely removed.

FIG. 5 illustrates a channel area of a TFT with ohmic contact layer completely removed. FIG. 6 illustrates an ohmic contact layer remaining in a channel area of a TFT. FIG. 6 can be regarded as an enlarged view of the TFT in FIG. 3A through 3D and FIGS. 4A and 4B.

Step II: In FIG. 3A, a laser irradiates the second insulating layer 16 to separate the drain DE into first part DE1 and second part DE2. The first part DE1 overlaps the channel layer 101, while the second part DE2 is spaced apart from (does not overlap) the channel layer 101. At this moment, a first through hole TH1 extending through the second insulating layer 16 and separating the drain electrode DE into the two parts is formed.

Figure 3B:
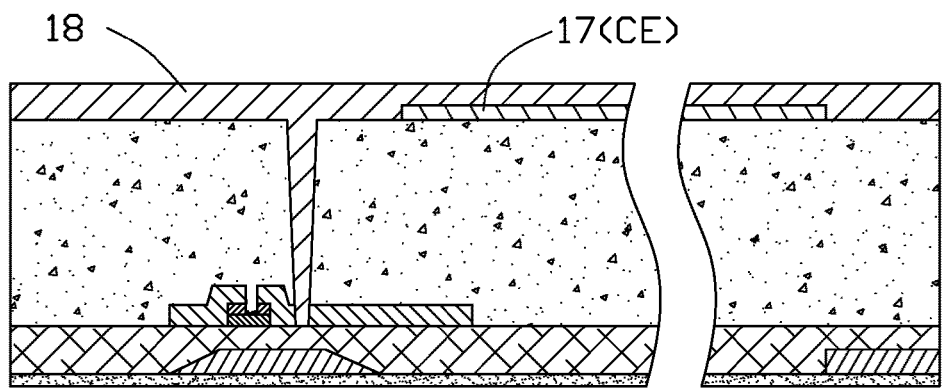

Step III: In FIG. 3B, a third insulating layer 18 is formed on the substrate 100 after the gate electrode GE and the drain electrode DE have been irradiated with the laser, to prevent the gate electrode GE and the drain electrode DE from oxidation.

The third insulating layer 18 covers the first through hole TH1. The third insulating layer 18 can be formed in same way and using same materials as the first insulating layer 12 and the second insulating layer 16. The third insulating layer 18 works as an insulator between the common electrode CE and a pixel electrode PE.

The method may further include the following steps.

Figure 3C:
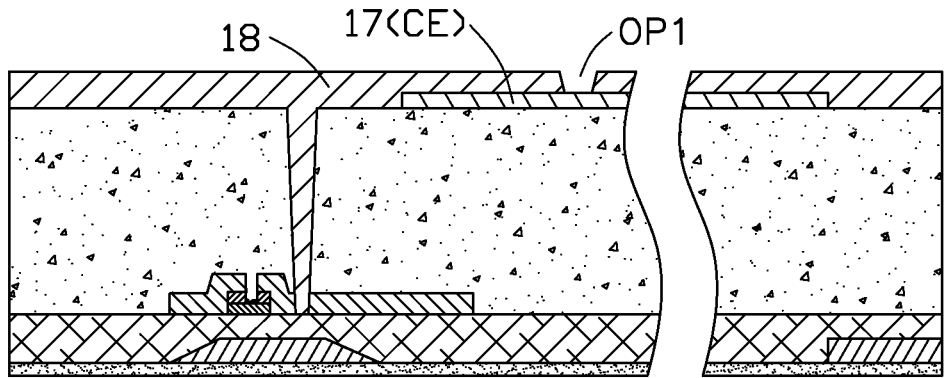

Step IIII: In FIG. 3C, a first opening OP1 is formed in the third insulating layer 18 by using laser in the in display area AA. The first opening OP1 extends through the third insulating layer 18.

The first conductive layer 17 is exposed through the first opening OP1. In this embodiment, the first opening OP1 is formed by laser to simplify the manufacturing process. In other embodiments, the first opening OP1 can also be formed in the third insulating layer 18 by photolithography including exposing, developing, and etching.

Figure 2:
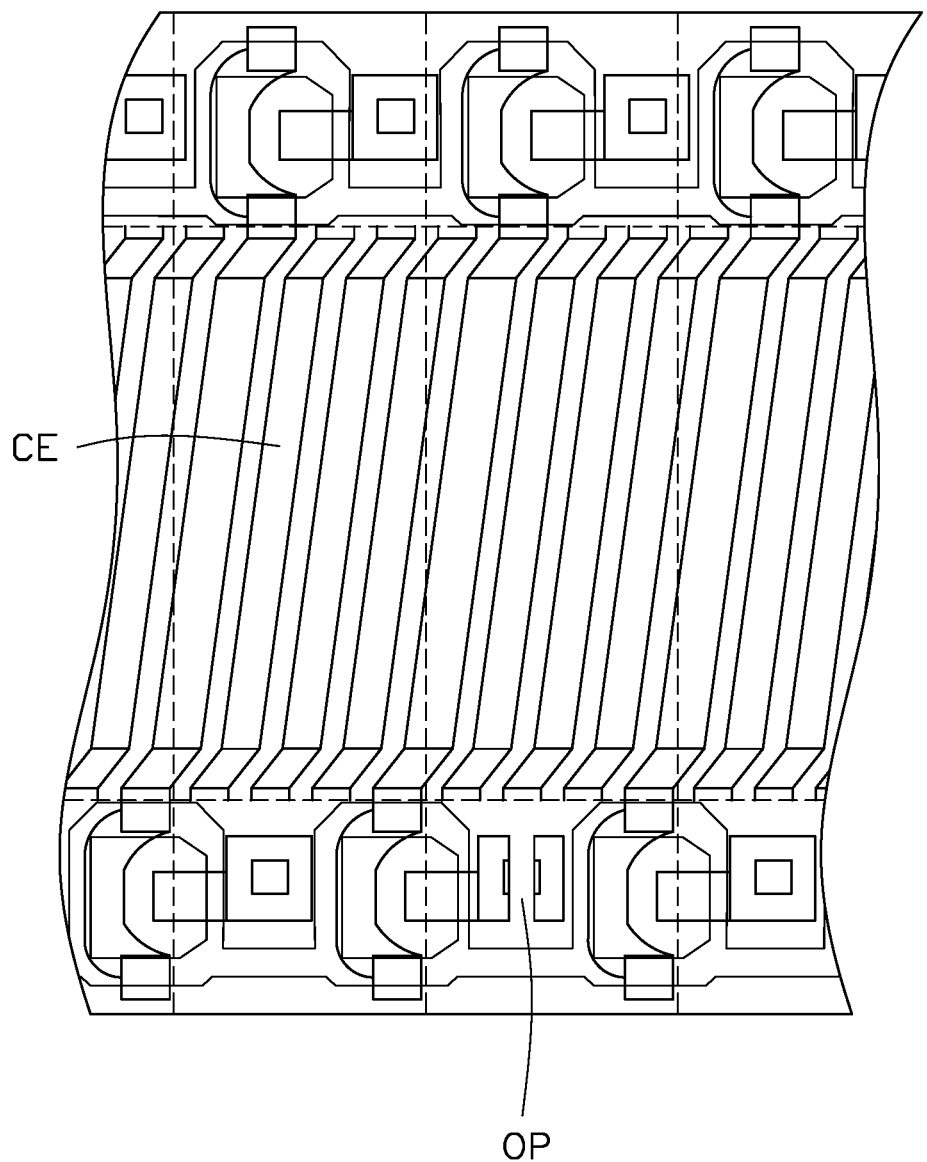
FIG. 2 is a plan view of the substrate after repairs according to the first embodiment of the present disclosure.
Figure 3D:
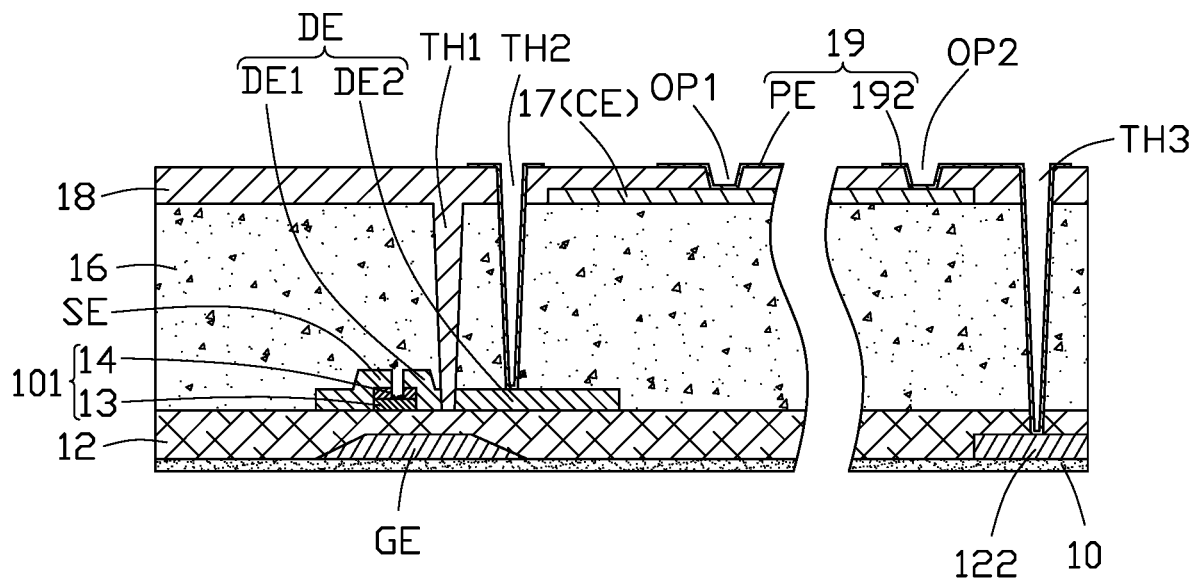

Step IV: In FIGS. 2 and 3D, a second conductive layer 19 is formed on the third insulating layer 18.

The second conductive layer 19 includes the pixel electrode PE located in the display area AA and a second peripheral conductive layer 192 located in the peripheral area NAA. The second conductive layer 19 (the pixel electrode PE) is electrically coupled to the first conductive layer 17 (the common electrode CE) in the display area AA. The second conductive layer 19 can be formed in same way and using same materials as the first conductive layer 17.

Step VI: another laser irradiates the second conductive layer 19. The laser passes through the second conductive layer 19, the third insulating layer 18, and the second insulating layer 16 to electrically couple the second conductive layer 19 to the second part DE2 of the drain electrode in the display area AA.

As shown in the FIG. 3D, the second conductive layer 19 is coupled to the second part DE2 by a second through hole TH2. As a result, the drain electrode DE is separated in two, the TFT cannot charge the pixel electrode PE. The pixel electrode PE is coupled to the common, electrode CE, thus a voltage difference between the pixel electrode PE and the common electrode CE becomes 0V. As to LCD panel of normal black type, when a display voltage becomes 0V a transmission rate of light becomes approximately 0V. The white defect turns into dark defect.

In this embodiment, the second part DE2 is electrically coupled to the second conductive layer 19 (the pixel electrode PE) to avoid changing the design of mask. In other embodiments, it is also possible that the drain electrode DE is not coupled to the second conductive layer 19 (the pixel electrode PE) in the subpixel being repaired.

Moreover, in the peripheral area NAA, the second peripheral conductive layer 192 is electrically coupled to the first conductive layer 17 by using laser. And the second peripheral conductive layer 192 is electrically coupled to the first peripheral electrode 122 by using laser. Thus, the second peripheral conductive layer 192 couples the first peripheral conductive layer 17 to the first peripheral electrode 122. At the same time, the first peripheral electrode 122 functions as a common electrode in the peripheral area NAA, and provides a common voltage signal to the first conductive layer 17.

According to the method of the first embodiment, the drain electrode DE is separated into two parts after the pixel electrode PE is formed. The first through hole TH1 of the drain electrode DE is covered by the insulating layer 18. Accordingly, the drain electrode DE and the gate electrode GE during and after the repairing are not oxidized. Consequently, display quality is improved.

Second Embodiment

In FIG. 4A-4B, the components which are equivalent to those of the first embodiment are designated by the same reference numerals, and descriptions may not be repeated.

The method of the present embodiment is different from the first embodiment in that a laser irradiates the third insulating layer 18 to form a first opening OP1 a in the display area AA. The first opening OP1 a extends through the third insulating layer 18 and the first conductive layer 17 (the common electrode CE). The second insulating layer 16 is exposed through the first opening OP1a.

Then, a second conductive layer 19 comprising a pixel electrode PE is defined on a surface of the third insulation layer 18. The second conductive layer 19 (the pixel electrode PE) is electrically coupled to the first conductive layer 17 (the common electrode CE) through the first opening OP1a.

The second embodiment of the present discourse achieves the same technical result as that of the first embodiment.

In the first and second embodiment of the present disclosure, only one opening (the first opening OP1a) is formed in the third insulation layer 18 in the display area AA to connect the first conductive layer 17 with the second conductive layer 19, to ensure an aperture rate. However, in other embodiments of the present disclosure, a plurality of openings can be formed in the display area AA to couple the two conductive layers, and a plurality of openings can also be formed in the peripheral area NAA to couple the two conductive layers.

Additionally, examples of forming at least one opening in the third insulating layer 18 before the second conductive layer 19 is formed are described in the first and second embodiments. As soon as the second conductive layer 19 is formed it can be directly coupled to the first conductive layer 17. Further, no opening needs to be defined in the third insulating layer 18. Instead, the second conductive layer 19 can be directly deposited on the third insulating layer 18. Then a laser irradiates the second conductive layer 19. The laser passes through the second conductive layer 19, the third insulation layer 18, and the first conductive layer 17 so as to directly couple the two conductive layers.

Third Embodiment

An active matrix substrate (substrate 100a) of the third embodiment is shown in FIG. 3D. The substrate 100a is obtained after the repair according to present disclosure. Only the subpixels requiring repair are described in detail as the first and second embodiment. The components which are equivalent to those of the first embodiment and the second embodiment are designated by the same reference numerals, and descriptions may not be repeated.

A plurality of pixel areas is defined on the substrate 100a of the third embodiment. At least one pixel area comprises a base 10, a gate electrode GE and a first peripheral electrode 122 formed on the base 10, and a first insulating layer 12 formed on a surface having the gate electrode GE and the first peripheral electrode 122 of the base 10. The first insulating layer 12 covers the gate electrode GE and the first peripheral electrode 122. A semi-conductor layer 13 and an ohmic contact layer 14 is formed on the first insulating layer 12. The semi-conductor layer 13 and the ohmic contact layer 14 consist a channel layer 101 of the TFT. The channel layer 101 is located corresponding with the gate electrode GE. A source electrode SE and a drain electrode DE are formed on opposite sides of the channel layer 101. Part of the source electrode SE and part of the drain electrode DE are covering the channel layer 101. A second insulating layer 16 is formed to cover the source electrode SE, the drain electrode DE, the channel layer 101, and the first insulating layer 12. A common electrode CE (17) is formed on the second insulating layer 16. The substrate 100a further comprises a first through hole TH1 extending through the second insulating layer 16. The first through hole TH1 separates the drain electrode DE into first and second parts DE1 and DE2, spaced away from each other. A third insulating layer 18 covers the second insulating layer 16 and the common electrode (CE 17). A pixel electrode PE and a second peripheral conductive layer 192 are both located on the third insulating layer 18. The third insulating layer 18 covers the first through hole TH1. A first opening OP1 and a second opening OP2 are defined where the pixel electrode PE overlaps the common electrode CE. The first opening OP1 is formed in the display area AA. The second opening OP2 is formed in the peripheral area NAA. The first opening OP1 and the second opening OP2 both extend through the third insulation layer 18. The pixel electrode PE is electrically coupled to the common electrode CE by the first opening OP1 and the second opening OP2. In other embodiments, as shown in FIG. 4B, the first opening OP1 and/or the second opening OP2 can also extend through the pixel electrode layer 19 so that the common electrode CE is electrically coupled to the pixel electrode PE.

Additionally, a second through hole TH2 is formed in the third insulation layer 18 and extends through the drain electrode DE so that the pixel electrode PE is electrically coupled to the second part DE2. The first part DE1 overlaps the channel layer 101. The second part DE2 is spaced apart from (does not overlap) the channel layer 101.)

Additionally, in the peripheral area NAA, the second peripheral conductive layer 192 is electrically coupled to the first peripheral electrode 122 by a third through-hole TH3.

In the display are AA, the drain electrode DE is separated into two parts. Thus, the TFT cannot charge the pixel electrode PE. During the display period, a display brightness of the pixel cannot be changed. Furthermore, the pixel electrode PE is coupled to the common electrode CE, thus a voltage difference between the pixel electrode PE and the common electrode CE becomes 0V. As to a LCD panel of normal black type, when a display voltage becomes 0V, a transmission rate of light becomes approximately 0V. The white defect turns into a dark defect.

In this embodiment, the second part DE2 is electrically coupled to the pixel electrode PE. In other embodiments, the drain electrode DE need not be coupled to the pixel electrode PE.

Moreover, in the peripheral area NAA, the second peripheral conductive layer 192 electrically couples the pixel electrode PE to the first peripheral electrode 122. At the same time, the first peripheral electrode 122 functions as a common electrode in the peripheral area NAA, and provides a common voltage signal to the pixel electrode PE.

The Fourth Embodiment

Figure 7:
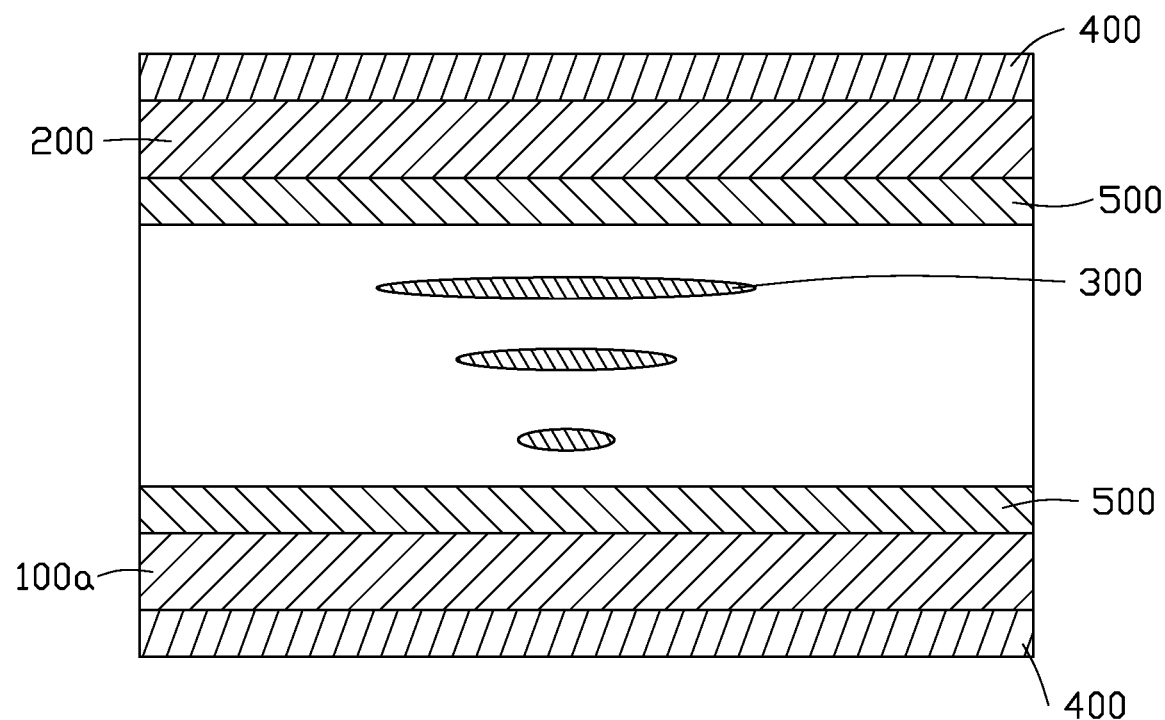
FIG. 7 is a schematic view of a display panel according to a fourth embodiment of the present disclosure.

In FIG. 7, the display panel 1 comprises the substrate 100*a* of the third embodiment. A color filter substrate 200 is deposited opposite to the active matrix substrate 100*a*, and a liquid crystal layer 300 is encapsulated between the substrate 100*a* and the color filter substrate 200. A polarizing sheet 400 is attached to outer surfaces (an opposite surface to a surface facing the liquid crystal layer 300) of the substrate 100*a*. Another polarizing sheet 400 is attached to outer surfaces (an opposite surface to a surface facing the liquid crystal layer 300) of the color filter substrate 200. An alignment film 500 is deposited on a surface near the liquid crystal layer 300 of the substrate 100*a*. Another alignment film 500 is deposited on a surface near the liquid crystal layer 300 of the color filter substrate 200. Additionally, the display panel 1 also includes a backlight device (not shown) and an optical film (not shown) together with other components. The color filter substrate 200 also comprises a color filter (not shown) located to correspond with the pixel area of the substrate 100*a*, and a black matrix (not shown) is located between two color filters.

According to the substrate 100*a* of the third embodiment and the display panel 1 of the fourth embodiment, the drain electrode DE and the gate electrode GE during and after the repairing are not oxidized. Consequently, display quality is improved.

It is to be understood, even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A method for repairing a white defect of a liquid crystal display (LCD) panel, the method comprising:
    providing a substrate defining a plurality of pixel areas by:
    forming a first metal layer on a base;
    covering the first metal layer with a first insulating layer;
    forming a channel layer on the first insulating layer, the channel layer comprising a semi-conductor layer and an ohmic contact layer;
    forming a second metal layer on the channel layer, the second metal layer comprising a source electrode and a drain electrode, electrically coupling the source electrode to the drain electrode by the channel layer;
    covering the second metal layer, the channel layer, and the first insulating layer with a second insulating layer; and
    forming a first conductive layer on the second insulating layer;
    forming a first through hole in the second insulating layer by laser, extending the first through hole through the second insulating layer and separating the drain electrode into two parts which are spaced apart from each other;
    overlapping the channel layer with a first part of the two parts, and spacing a second part of the two parts apart from the channel layer;
    covering the first conductive layer, the second insulating layer and the though hole by a third insulating layer, the third insulating layer partially formed in the through hole;
    forming a second conductive layer on the third insulating layer;
    coupling the first conductive layer to the second conductive layer by laser; and
    forming a second through hole in the third insulating layer, extending the second through hole to the drain electrode, and electrically coupling the first conductive layer to the second part by the second through hole.

2. The method of claim 1, wherein coupling the first conductive layer to the second conductive layer further comprises forming at least one opening in the third insulating layer and extending the at least one opening through the first conductive layer, and electrically coupling the second conductive layer to the first conductive layer by the at least one opening.

3. The method of claim 1, wherein the substrate is provided with a display area and a peripheral area surrounding the display area, the first metal layer is formed by forming a peripheral metal layer in the peripheral area, the first conductive layer is further formed by extending the first conductive layer into the display area and the peripheral area, the second conductive layer is further formed by forming a second peripheral conductive layer in the peripheral area, and the method further comprises electrically coupling the first conductive layer to the second peripheral conductive layer by the peripheral metal layer.

4. The method of claim 3, wherein the second conductive layer is formed by providing a pixel electrode in the display area, the first conductive layer is further formed by providing a common electrode and electrically coupling the common electrode to the pixel electrode.

5. The method of claim 3, wherein coupling the first conductive layer to the second conductive layer comprises forming at least one opening in the third insulating layer by laser, and covering the at least one opening with the second conductive layer to couple the second conductive layer to the first conductive layer.

6. The method of claim 5, wherein coupling the first conductive layer to the second conductive layer further comprises extending the at least one opening through the third insulating layer, and electrically coupling the second conductive layer to the first conductive layer by the at least one opening.

7. The method of claim 3, wherein coupling the first conductive layer to the second conductive layer comprises irradiating the second conductive layer with a laser, and directly coupling the second conductive layer to the first conductive layer.

\* \* \* \* \*